United States Patent
Saxelby, Jr. et al.

[11] Patent Number: 5,876,859
[45] Date of Patent: Mar. 2, 1999

[54] DIRECT METAL BONDING

[75] Inventors: John R. Saxelby, Jr., Maynard; Brant T. Johnson, Concord, both of Mass.

[73] Assignee: VLT Corporation, San Antonio, Tex.

[21] Appl. No.: 573,589

[22] Filed: Dec. 15, 1995

Related U.S. Application Data

[63] Continuation of Ser. No. 336,994, Nov. 10, 1994, abandoned.

[51] Int. Cl.⁶ .................................................. B32B 15/04
[52] U.S. Cl. ............................ 428/621; 428/627; 428/632
[58] Field of Search ................................... 228/718, 721, 228/722.1, 723.1, 793, 795, 214, 262.2; 29/831, 846; 428/420, 632, 614, 615, 621, 627, 633, 594

[56] References Cited

U.S. PATENT DOCUMENTS

| | | | |
|---|---|---|---|
| 3,621,338 | 11/1971 | Rogers et al. | 317/101 |
| 3,683,241 | 8/1972 | Duncan | 317/234 |
| 3,737,729 | 6/1973 | Carney | 317/101 |
| 4,211,354 | 7/1980 | Hoffman et al. | 228/118 |
| 4,218,724 | 8/1980 | Kaufman | 361/395 |
| 4,267,953 | 5/1981 | Hoffman et al. | 228/118 |
| 4,278,990 | 4/1981 | Fichot | 357/81 |
| 4,400,762 | 8/1983 | Bartley et al. | 361/402 |
| 4,417,296 | 11/1983 | Schelhorn | 361/386 |
| 4,483,810 | 11/1984 | Bunk et al. | 264/60 |
| 4,531,145 | 7/1985 | Wiech, Jr. | 357/81 |
| 4,551,746 | 11/1985 | Gilbert et al. | 357/74 |
| 4,551,747 | 11/1985 | Gilbert et al. | 357/74 |
| 4,591,401 | 5/1986 | Neidig et al. | 156/89 |
| 4,603,474 | 8/1986 | Gobrecht et al. | 228/194 |
| 4,724,283 | 2/1988 | Shimada et al. | 174/68.5 |
| 4,740,414 | 4/1988 | Shaheen | 428/210 |
| 4,750,089 | 6/1988 | Derryberry et al. | 361/388 |
| 4,769,525 | 9/1988 | Leatham | 219/209 |
| 4,783,695 | 11/1988 | Eichelberger et al. | 357/65 |
| 4,783,697 | 11/1988 | Benenati et al. | 357/80 |
| 4,847,136 | 7/1989 | Lo | 428/195 |
| 4,872,081 | 10/1989 | Murphy et al. | 361/117 |
| 4,879,630 | 11/1989 | Boucard et al. | 361/386 |
| 4,918,811 | 4/1990 | Eichelberger et al. | 29/840 |
| 4,953,005 | 8/1990 | Carlson et al. | 357/80 |
| 4,985,097 | 1/1991 | Matsumura et al. | 156/87 |
| 4,994,215 | 2/1991 | Wiech, Jr. | 264/27 |

(List continued on next page.)

FOREIGN PATENT DOCUMENTS

| | | |
|---|---|---|
| 0141582 | 5/1985 | European Pat. Off. . |
| 0 577 484 A1 | 1/1994 | European Pat. Off. . |
| 61-156791 | 7/1986 | Japan . |
| 61-177762 | 8/1986 | Japan . |
| 63-119242 | 5/1988 | Japan . |
| 1-161892 | 6/1989 | Japan . |
| 4-83367 | 3/1992 | Japan . |
| 4-346260 | 12/1992 | Japan . |
| 6-48851 | 2/1994 | Japan . |
| 6-90083 | 3/1994 | Japan . |

OTHER PUBLICATIONS

Packaging Electrical Circuits, U.S. application No. 08/337,269, filed Nov. 10, 1994.

Gates and Yokoro, Sealed Chip–On Board Circuit Protection:, 3rd International SAMPE Electronics Conference, Jun. 20–22, 1989, pp. 929–938.

*Primary Examiner*—John J. Zimmerman
*Attorney, Agent, or Firm*—Fish & Richardson P.C.

[57] ABSTRACT

A method for use with a direct metal bonding type process in which a metal layer is bonded to an insulating layer. The metal layer is applied to the insulating layer to enable a direct metal bond to be formed between the layers. The integrity of the bond between a portion of the layers is reduced by providing, prior to bonding, an interrupter between the portion of the layers. A structure in which a metal layer is directly metal bonded to an insulating layer and includes an interrupter between a portion of the metal layer and a portion of the insulating layer. The interrupter reduces the integrity of the bond between the portion of the metal layer and the portion of the insulating layer. The structure includes other features similar to those set forth with respect to the above described method.

41 Claims, 6 Drawing Sheets

U.S. PATENT DOCUMENTS

| | | | |
|---|---|---|---|
| 4,996,116 | 2/1991 | Webster et al. | 428/627 |
| 5,006,673 | 4/1991 | Freyman et al. | 174/255 |
| 5,019,941 | 5/1991 | Craft | 361/386 |
| 5,019,946 | 5/1991 | Eichelberger et al. | 361/414 |
| 5,028,987 | 7/1991 | Neugebauer et al. | 357/80 |
| 5,100,740 | 3/1992 | Neugebauer et al. | 228/121 |
| 5,139,972 | 8/1992 | Neugebauer et al. | 437/209 |
| 5,176,309 | 1/1993 | Horiguchi et al. | 228/122 |
| 5,213,877 | 5/1993 | Yoshida et al. | 228/121 |
| 5,216,279 | 6/1993 | Nakao | 257/712 |
| 5,280,850 | 1/1994 | Horiguchi et al. | 228/122.1 |
| 5,324,890 | 6/1994 | Lawlyes | 174/52.4 |
| 5,328,751 | 7/1994 | Komorita et al. | 428/209 |
| 5,365,403 | 11/1994 | Vinciarelli et al. | 361/707 |

DIRECT METAL BONDING

This is a continuation of application Ser. No. 08/336,994, filed Nov. 10, 1994, now abandoned.

BACKGROUND

This invention relates to direct metal bonding.

Directly bonding copper (DBC) to a ceramic insulator has been done for years. Generally, a layer of copper is laid over a layer of ceramic, typically aluminum oxide ($Al_2O_3$) or aluminum nitride (AlN), and then brought to a temperature of about 1064° C. The copper layer may be oxidized before being laid on the ceramic layer, or oxygen may be injected into the furnace to cause oxidation. Alternatively, a layer of bonding material can be inserted between the copper layer and the ceramic layer. In either case, the result is a strong oxide or eutectic bond between the copper and the ceramic layers. Typically, the bonded copper/ceramic sheet is then passed through a photo-imaging process to create a conductive circuit pattern for use with a printed circuit board (PCB), but there are also other uses for the copper/ceramic sheet.

The conductive circuit pattern can be used in integrated circuit components such as power converters, referred to as integrated power devices (IPD). Military specification 883D 1010.7 requires integrated circuit components to be tested over a temperature range of −55° C. to 150° C. Copper has a thermal expansion coefficient of approximately $16 \times 10^{-6}$ inches per inch per degree C., whereas the ceramic (aluminum oxide, $Al_2O_3$) generally has a much lower thermal expansion coefficient of about $8 \times 10^{-6}$ inches per inch per degree C. As a result, when the copper/ceramic sheet is exposed to different temperatures, the copper layer expands and contracts more than the ceramic layer.

The eutectic bond is strong and limits the expansion and contraction of the copper layer in the area of the bond. As a result, the confined copper layer exerts stress on the ceramic layer through the bond. Typically, a relatively thin layer of copper, about 0.001 inch, is able to flex and stretch without causing damage to the ceramic layer. Increasing the thickness of the copper layer, however, increases the amount of stress inflicted on the ceramic layer.

Figure 1:
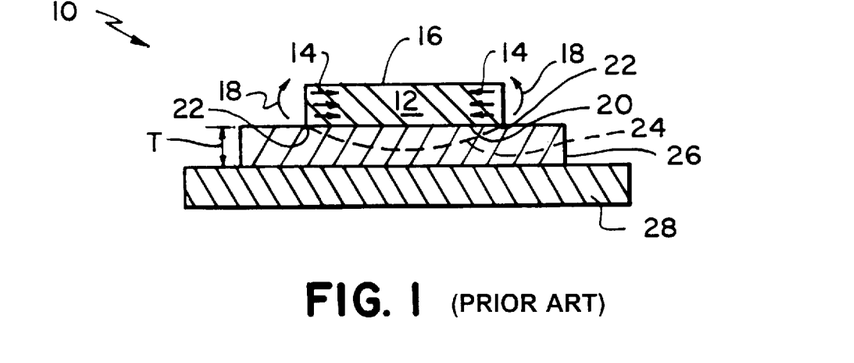
FIG. 1 is a cross-sectional side view of a copper layer directly metal bonded to a ceramic layer.

Referring to FIG. 1, if the copper/ceramic layer 10 is exposed to a high temperature, for example, 150° C., and then to a low temperature, for example, −55° C., the copper layer 12 will contract in a direction 14. Because there is nothing limiting the contraction of the copper layer 12 at a surface 16, a pulling effect, indicated by arrows 18, is created between the surface 18 of the copper layer and the area of the bond 20. The pulling effect 18 forms weak points 22 along the edges of the bond. Ceramic is weak in tension and, if pulled on, will break. Thus, over time the pulling effect 18 can cause conoidal fractures 24, i.e., cracks or craters in the ceramic layer 26.

The ceramic layer 26 is often used as an electrical insulator between the copper layer 12 and another conductive layer 28. The thickness T of the ceramic layer is one factor that determines the breakdown voltage level of the ceramic layer. Cracks or conoidal fractures in the ceramic provide shorter breakdown paths between the copper layer 12 and the conductive layer 28 which can result in an insufficiently low breakdown voltage. Moreover, even if initial cracks do not reduce the breakdown voltage to an insufficient level, "crack propagation" can lead to more cracks and larger cracks over time that may indeed result in an insufficiently low breakdown voltage.

Another difficulty with directly bonding a layer of copper to a layer of ceramic is the formation of tents between the two layers, which is often referred to as the "tenting effect." In general, tenting effect is increased as the thickness of the layer of copper is decreased. There are varying theories in the industry as to how tents are formed.

Figure 2:
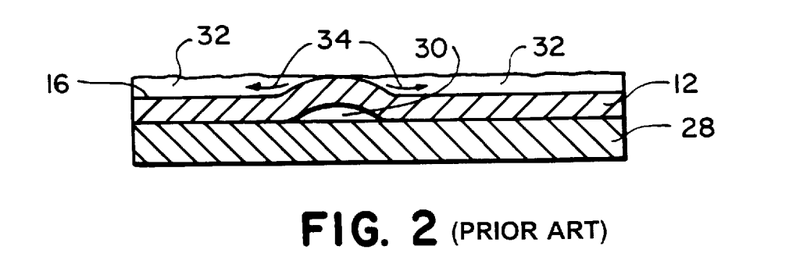
FIGS. 2 and 3 are cross-sectional side views of a tent between a copper layer directly metal bonded to a ceramic layer.
Figure 3:
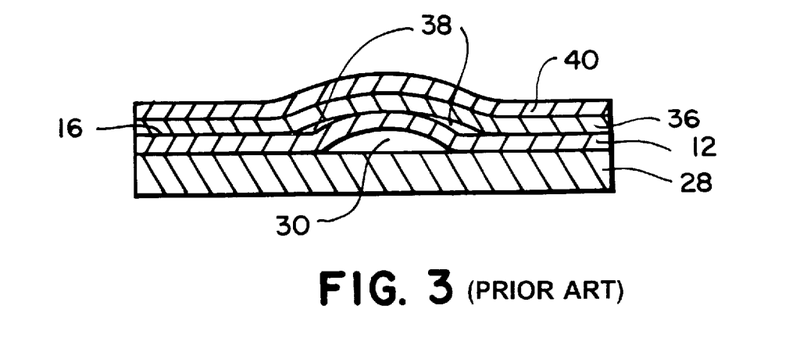

Referring to FIGS. 2 and 3, a tent 30 is an elevated area between the two layers in which eutectic bond is not formed. Tents cause many difficulties in the subsequent photo-imaging process steps. For instance, if a liquid photo-imaging layer 32 (FIG. 2) is applied to the surface 16 of copper layer 12, then the liquid may roll off the tent, indicated by arrows 34, leaving a portion of the surface 16 uncovered. If a film photo-imaging layer 36 (FIG. 3) is applied to surface 16, then the film may not lay flat against surface 16 and may leave gaps 38 between the surface 16 and the film 36. Similarly, a photo-imaging tool 40 (i.e., a negative) may also not lay flat.

Also, because the areas of the copper/ceramic sheet which contain tents represent defects, an additional manufacturing step is required to detect and remove them.

SUMMARY

In general, in one aspect, the invention features a method for use with a direct metal bonding type process in which a metal layer is bonded to an insulating layer. The metal layer is applied to the insulating layer to enable a direct metal bond to be formed between the layers. The integrity of the bond between a portion of the layers is reduced by providing, prior to bonding, an interrupter between the portion of the layers.

Implementations of the invention may include the following features. The interrupter's reduction of the integrity of the bond may eliminate or weaken the bond between the portion of the metal layer and the portion of the insulating layer. The insulating layer is ceramic, and the metal layer is copper. Both of the layers are flat. The interrupter is formed on one of the layers, and the interrupter is metal. The interrupter is rubbed onto one of the layers. The interrupter is rubbed onto the insulating layer. The interrupter is nickel and is plated on the portion of the metal layer. The interrupter is copper, rubbed on the portion of the insulating layer, and nickel, deposited on the portion of the insulating layer in an area of the copper rub, between the copper rub and the portion of the metal layer. The nickel interrupter is deposited using an electroless process. The interrupter is nickel and is rubbed onto the portion of the insulating layer. The interrupter is iron and is rubbed onto the portion of the insulating layer. The interrupter is a pattern of interrupters between portions of the metal layer and portions of the insulating layer. A conductive run on a substrate is electrically connected to the portion of the metal layer on a side of the metal layer opposite to the insulating layer. The interrupter is a pattern of interrupters between portions of the metal layer and portions of the insulating layer, and conductive runs on a substrate or many substrates are connected to the portions of the metal layer.

In general, in another aspect, the invention features a structure in which a metal layer is directly metal bonded to an insulating layer and includes an interrupter between a portion of the metal layer and a portion of the insulating layer. The interrupter reduces the integrity of the bond between the portion of the metal layer and the portion of the insulating layer. The structure includes other features similar to those set forth with respect to the above described method.

Advantages of the invention include the following. The interrupter accommodates for the thermal expansion coefficient mismatch between the portion of the metal layer and the portion of the insulator which results in a reduction or elimination of cracks and conoidal fractures in the insulating layer. As a result, the breakdown voltage of the insulating layer is not reduced. The formation of tents between the insulating layer and the copper layer is also reduced.

A variety of other advantages and features will become apparent from the following description and from the claims.

DESCRIPTION

Figure 4:
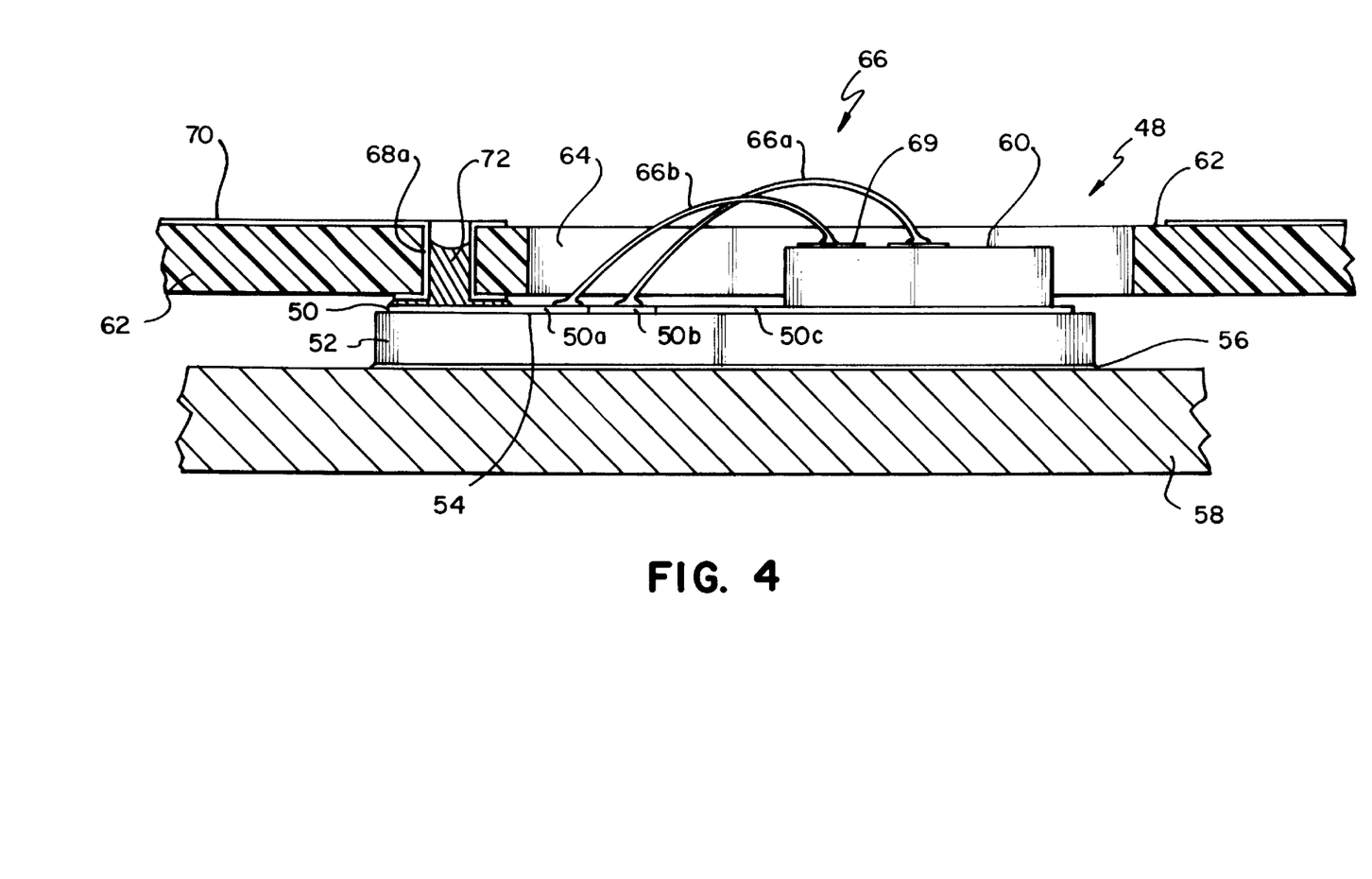
FIGS. 4 and 5 are cross-sectional and perspective side views showing an electrical circuit packaging structure.

Referring to FIG. 4, an integrated power device (IPD) 48 (which may be part of a power converter) includes a first copper layer 50 directly bonded to a ceramic layer 52 through eutectic bond 54. Ceramic layer 52 may be either aluminum oxide or aluminum nitride. As an example, ceramic layer 52 is glued (using an adhesive 56) to conductive baseplate 58. Ceramic layer 52 can be connected to conductive baseplate 58 in a variety of ways. In either case, ceramic layer 52 is an electrical insulator between the first copper layer 50 and the conductive baseplate 58.

Figure 5:
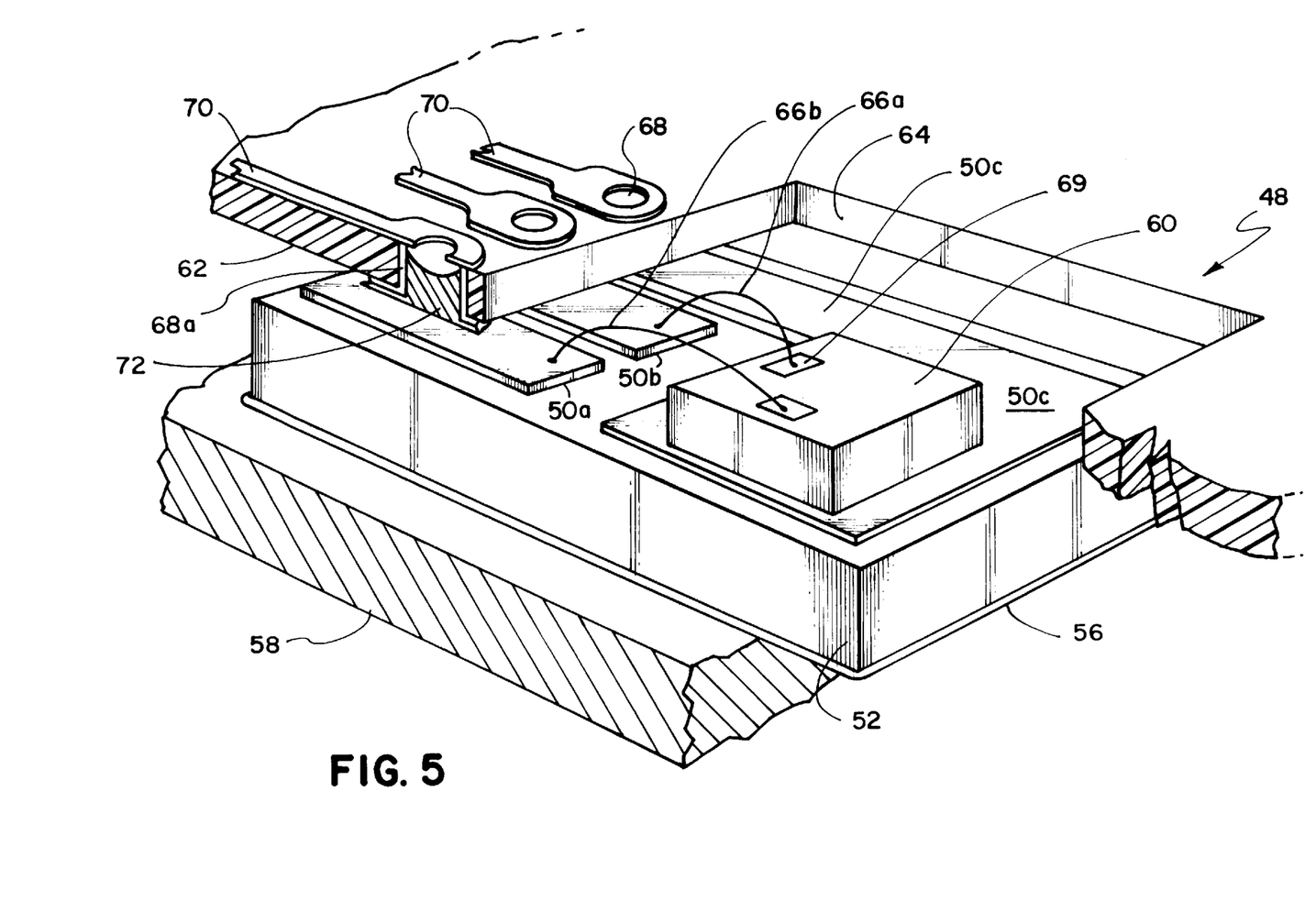

Referring also to FIG. 5, copper layer 50 is a conductive circuit pattern and has several sections, 50a, 50b, 50c (i.e., conductive pads). A semiconductor die 60 (a power dissipating device) is soldered (solder not shown) directly to copper pad 50c. Ceramic layer 52 provides efficient heat transfer between the die 60 and the baseplate 58. The portion of copper pad 50c which extends beyond die 60 may be used for making an electrical connection to the die. The bottom surface of the die 60 is frequently one of the terminals for the device (e.g., the anode or cathode of a diode or the drain terminal of a field-effect transistor). The extended portion of copper pad 50c also serves as an surface that spreads heat from the die over a relatively large surface of ceramic layer 52. This reduces the overall thermal resistance between the relatively smaller die 60 and the baseplate 58.

A multilayer printed circuit board 62 (PCB) has hole 64 through which die 60 and bond wires 66 pass, and several smaller holes 68 (FIGS. 4 and 5) corresponding in number and location to the copper layer sections 50a, 50b, 50c (i.e., conductive pads). Copper layer pads 50a, 50b, and 50c are electrically connected to bond wires 66 which are electrically connected to terminals 69 on the top of die 60. A conductive run 70 is formed on the top and bottom surfaces of PCB 62 in the vicinity of each hole 68 and also through the holes themselves thus creating conductive through holes. Electrical connection between a conductive run 70 and the corresponding copper pad is achieved by soldering 72, e.g., reflow soldering. The relatively large surface area between the solder and the inner wall of the through hole provides substantial mechanical strength to the solder bond.

As seen in FIG. 5, hole 64 in PCB 62 saves space because the height of the semiconductor die 60 is coextensive with the height of PCB 62.

Additional information about packaging electrical components is set forth in U.S. patent application Ser. No. 08/177,797, filed Jan. 6, 1994 (issued as U.S. Pat. No. 5,365,403 on Nov. 15, 1994) which is a continuation of Ser. No. 07/914,347, filed Nov. 24, 1993, now abandoned, assigned to the same assignee as this application, and incorporated by reference.

During testing, integrated power device 48 may be exposed to a variety of temperatures, including a temperature cycle test of −55° C. to 150 C. Although eutectic bond 54 limits the expansion and contraction of copper pads 50a, 50b, and 50c, the pads alone are thin enough, approximately 0.005 inches, to stretch and flex without causing damage to ceramic layer 52. The thermal expansion coefficient of the semiconductor die 60 (silicon, Si) is approximately $7 \times 10^{-6}$ inches per inch per degree C., and, as a result, the expansion and contraction of the area of the copper layer 50c under the die 60 is further restricted and less able to exert stress on ceramic layer 52. The area under holes 68, however, exert the pressure of a much thicker layer of copper and can cause cracks, craters, and conoidal fractures in the ceramic layer 52.

Figure 6:
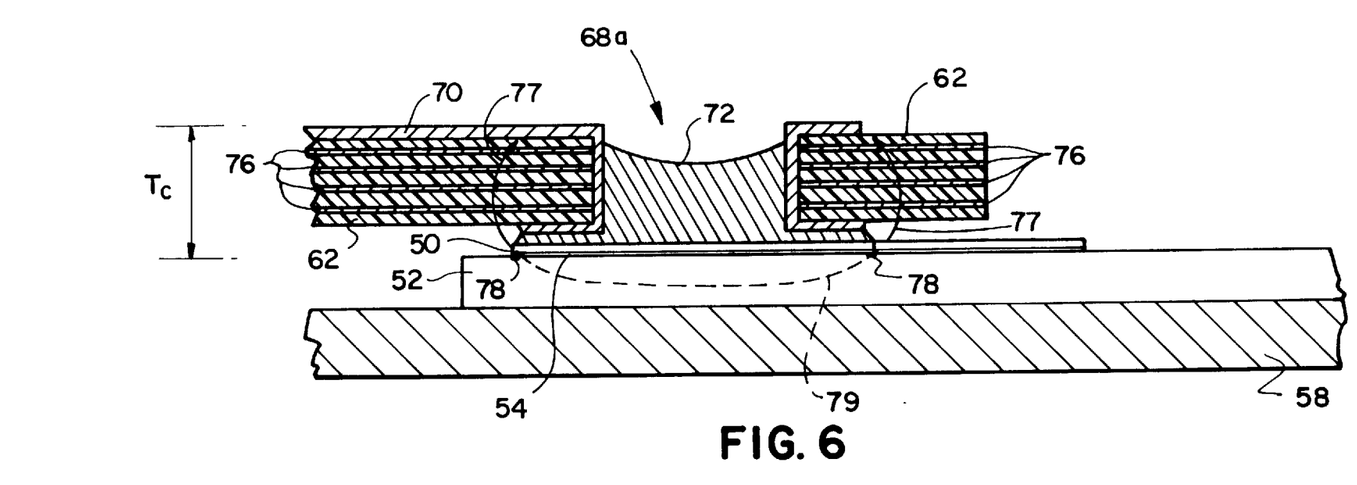
FIG. 6 is an enlarged cross-sectional view of a portion of the structure of FIG. 4.
Figure 7:
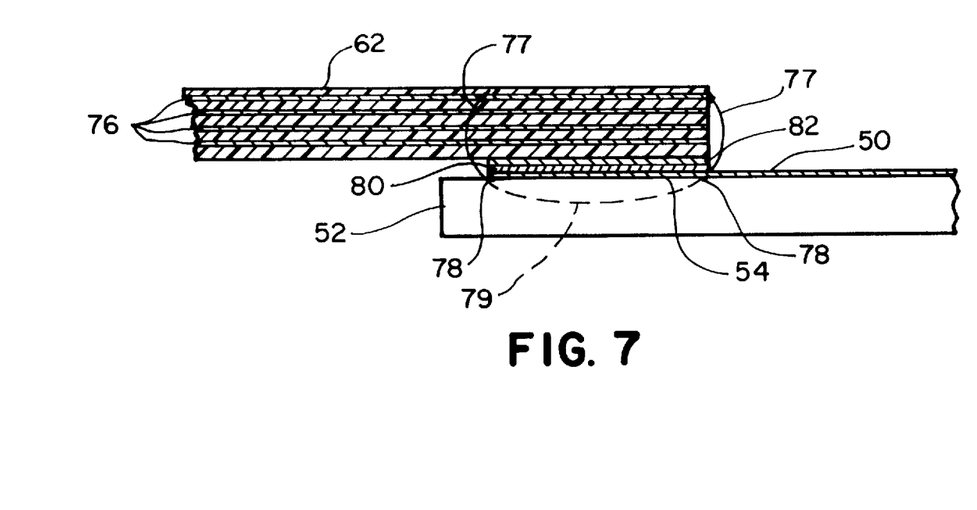
FIG. 7 is a cross-sectional side view of an electrical connection.

Referring to FIG. 6, conductive run 70 is generally a layer of copper that is approximately 0.0015 inches thick. Conductive run 70 extends through hole 68a to provide a copper layer on the bottom of PCB 62 as well as on the top. Multilayer PCBs typically include internal conductive copper layers of about 0.001 inches in thickness. PCB 62 is shown to have four such internal copper layers 76. The combination of conductive run 70, conductive layers 76, and copper layer 50 around hole 68a creates the effect of a much thicker $T_c$, approximately 0.025 inches, copper layer. The stress exerted by this copper "column" as it contracts, for example, as indicated by arrows 77, pulls up on ceramic layer 52 at weak points 78 along the edge of eutectic bond 54 and, as a result, causes conoidal fractures 79 in ceramic layer 54. Furthermore, the same result can occur where hole 68a does not exist, but copper layer 50 is soldered 80 to a conductive run 82 on the bottom of PCB 62, as shown in FIG. 7.

To reduce the stress inflicted on the ceramic layer 52, as the copper expands and contracts, the direct bonding of copper to ceramic is interrupted (i.e., the eutectic or oxide bond 54 is weakened or prevented), in the area where the copper layer is connected to the PCB. One method prevents the eutectic bond by plating nickel on the copper layer, in the areas where the copper layer is to be connected to the PCB and on a side of the copper layer that will be adjacent to the ceramic layer, prior to bonding the copper layer to the ceramic layer (i.e., DBC process). This method will be referred to as the nickel plating process. The process of plating nickel to copper is known. The nickel/copper bond will not be disturbed by the subsequent DBC process because nickel is relatively inert and the melting point of nickel is much higher, approximately 1453° C., than the DBC process, about 1064° C.

Figure 8:
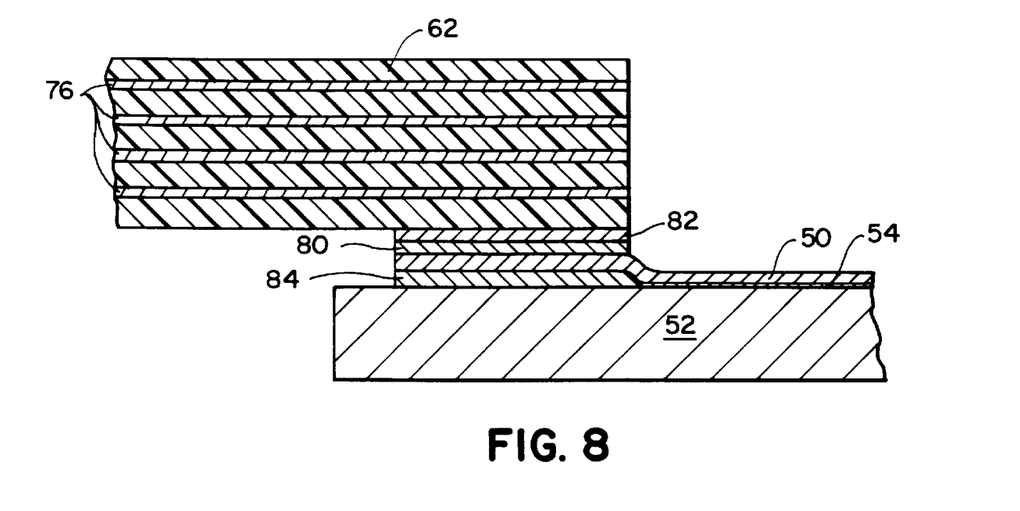
FIGS. 8 and 9c are cross-sectional side views of another electrical connection and an interrupter.

As shown in FIG. 8, copper layer 50, which has not yet be etched into a conductive circuit pattern, is bonded to a nickel layer 84, of approximately 50–100 microinches in thickness, in the area of conductive run 82 of PCB 62. Outside the area of conductive run 82, copper layer 50 continues to be bonded to ceramic layer 52 through eutectic bond 54. The attachment of the nickel layer 84 and the ceramic layer 52 is very weak or nonexistent. As a result, as the temperature changes, the expansion and contraction of the copper in the area of connection to PCB 62 does not induce stress on ceramic layer 52 and no cracks, craters, or conoidal fractures are formed in ceramic layer 52.

After the DBC process, the copper layer 50 is etched to form a conductive circuit pattern on ceramic layer 52. The etching process does not remove nickel layer 84 from between copper layer 50 and ceramic layer 52, but the etching process does remove any nickel from the ceramic layer 52 in the area being etched. This prevents excess nickel from electrically connecting different portions of the conductive circuit pattern.

Figure 9A:
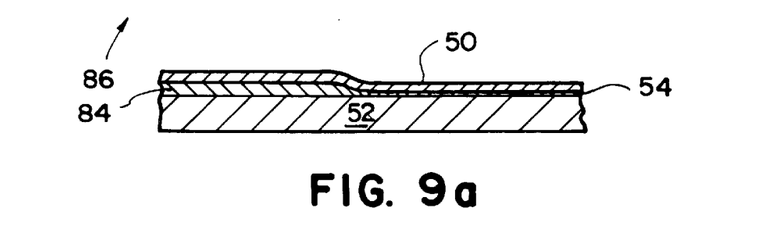
FIGS. 9a and 9b are cross-sectional side views of a copper layer directly metal bonded to a ceramic layer and an interrupter.
Figure 9B:
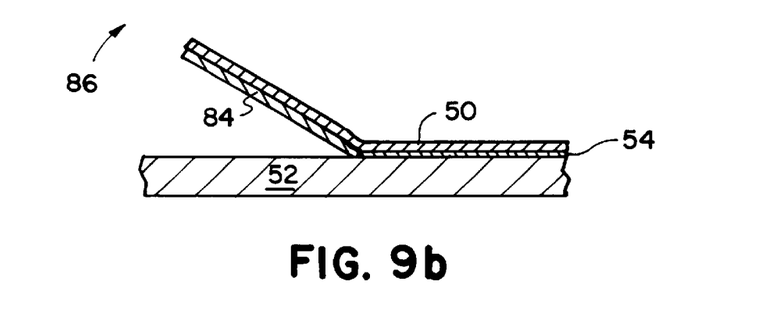
Figure 9C:
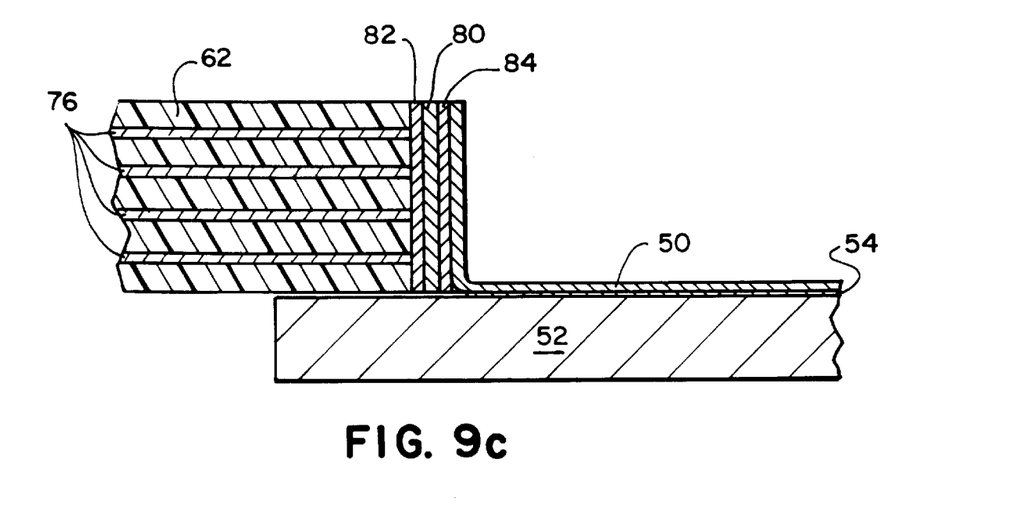

Referring to FIGS. 9a, 9b, and 9c, the very weak or nonexistent eutectic bond between the copper and ceramic layers in the areas where the copper layer is to be connected to the PCB, formed by the nickel plating process (and the copper rub process, described below), allows the copper layer 50 in those areas to be peeled away, in a direction indicated by arrow 86, from the ceramic layer 52. The peeled away copper layer may then be used to connect to PCB 62 in a variety of ways, including the arrangement depicted in FIG. 9c.

Figure 10:
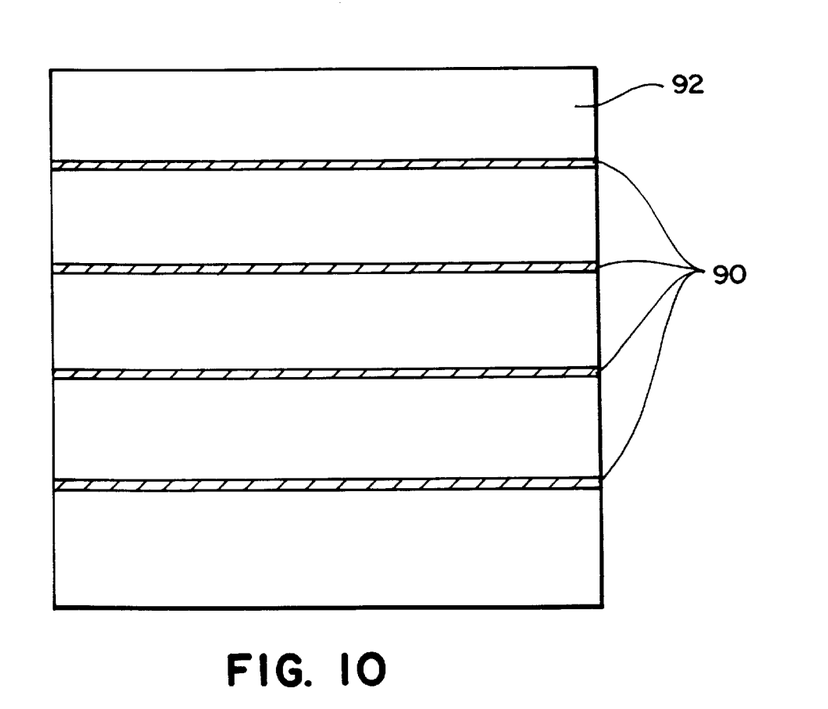
FIG. 10 is a plan view of an interrupter pattern on a copper layer.

Referring to FIG. 10, a pattern 90 is shown on a copper layer 92. There are many possible patterns 90, including more complicated patterns.

Another benefit of this process is a reduction in the tenting effect (i.e., fewer tents are formed between the copper layer and the ceramic layer). Although the cause of tents is not fully understood, it is likely that tents are formed by gas that is released during the DBC process but which does not escape from between the copper and ceramic layers. If this is true, the addition of nickel plating on the copper layer reduces the number of tents for two reasons. First, because the nickel layer does not bond to the ceramic layer, the nickel plating provides paths between the copper and ceramic layers through which the gas can escape. Second, nickel is a "getter" in that it reacts aggressively with oxygen to form nickel oxide. The largest amount of gas released in the DBC process is oxygen. Hence, the nickel plating reduces the volume of gas, i.e., oxygen, that needs to escape from between the copper and the ceramic layers. Further, it is difficult to remove the oxygen from the nickel once nickel oxide is formed.

To use the DBC process to make printed circuit boards (PCBs), the layer of copper would have to be as thin as 0.001 inches. The tenting effect, however, has limited the industry to a copper layer of about 0.008 inches in thickness. Because the nickel plating process reduces the number of tents, the thickness of the copper layer can also be reduced. The nickel plating process described above has been used to bond a copper layer of about 0.005 inches in thickness to a ceramic layer for an integrated power device (IPD) 48 (FIGS. 4 and 5). The copper layer of the IPD cannot be thinner due to the amount of current that the copper layer must carry. This thickness also allows the entire IPD height to be 0.003 inches lower than if an industry standard DBC process is used. It is to be understood, however, that thinner copper layers can be directly bonded to ceramic layers with reduced tenting effect using the above described nickel plating process.

Nickel plating requires several process steps, which increases the cost of manufacturing, and the nickel plating process is a wet process, which exposes the copper to possible contaminants and residues. Additionally, the nickel pattern, indicating the areas of connection to the PCB, is plated on a side of the copper layer that is hidden after the DBC process. The edges of the ceramic layer are used as reference points to align the copper/ceramic sheet during the steps of the photo-imaging process. The nickel pattern, however, cannot be precisely determined by reference to the ceramic layer edges. Therefore, the nickel plating process makes alignment of the copper/ceramic sheet more difficult.

Other problems can be caused by subsequent wet photo-imaging process steps. Because the eutectic bond is either very weak or nonexistent in the areas where the copper layer is to connect to the PCB, the liquids used in the wet process steps can seep between the ceramic and nickel layers. Contamination problems may result if the liquids used are not fully removed in each step.

Another method of preventing the eutectic bond between the copper and ceramic layers, referred to as the copper rub process, involves rubbing the ceramic layer, in the areas where the copper layer is to be connected to the PCB, with a copper wire. A copper rub pattern will be created on the ceramic layer similar to the pattern 90 on copper layer 92 in FIG. 10. An electroless process is then used to deposit nickel onto the ceramic layer in the area of the copper rub prior to the DBC process. About 50 to 100 microinches of nickel can be deposited. This nickel layer thickness is sufficient to prevent the copper and the ceramic layers from bonding in the areas where the nickel is deposited.

Again, after the DBC process, when copper layer 50 is etched, any nickel or copper from the copper rub in the areas being etched will also be removed.

All the advantages of the nickel plating process are realized with the copper rub process, and additionally, the copper rub process eliminates the many steps required to plate nickel to copper. Moreover, because the nickel is deposited on the ceramic layer, the nickel deposits can be precisely located which makes alignment during the subsequent photo-imaging process steps easier.

One method of weakening, but not preventing, the eutectic or oxide bond between the copper and ceramic layers, referred to as the nickel rub process, involves rubbing the ceramic layer with a nickel wire prior to the DBC process. A nickel rub pattern will be created on the ceramic layer similar to the pattern 90 on copper layer 92 in FIG. 10. A nickel layer of approximately four microinches is left on the ceramic layer. This thickness of nickel is insufficient to completely prevent the eutectic bond from forming between the copper and ceramic layers, but the nickel layer does reduce the strength of the eutectic bond. Hence, conoidal fractures may still be formed in the ceramic layer 52 (FIGS. 4 and 5) but to a lesser extent than in the conventional DBC process alone. The nickel layer continues to reduce the tenting effect.

After the DBC process, any nickel from the nickel rub in the areas where copper layer 50 is being etched will also be etched away.

Another method of weakening the eutectic bond, referred to as the iron rub process, involves rubbing the ceramic layer with an iron wire prior to the DBC process. Iron, like nickel, has a higher melting point, about 1535° C., than the temperature of the DBC process, approximately 1064° C. An iron rub pattern will be created on the ceramic layer similar to the pattern 90 on copper layer 92 in FIG. 10. An iron rub thickness of four microinches is provided which does not prevent the copper layer from bonding with the ceramic layer in the area of the iron rub but does significantly weaken the eutectic bond. Therefore, although cracks may form in the ceramic layer they will be minimal and only slightly reduce the breakdown voltage of the ceramic layer. Also like nickel, iron is an aggressive "getter" and readily absorbs free oxygen to form iron oxide. Hence, the tenting effect is reduced when the iron rub process is used.

Another advantage to the iron rub process is that the entire process, up to the photo-imaging process, is a dry process. This reduces the impact on the environment and reduces the contamination of the ceramic layer.

After the DBC process, when copper layer 50 is etched, iron from the iron rub in the areas being etched will not be etched away. The DBC process and the photo-imaging process, however, leave the iron rub in those areas non-conductive which prevents the iron rub in those areas from forming electrical connections between portions of the conductive copper circuit pattern.

Because the nickel rub and iron rub processes weaken but do not prevent the eutectic bond, liquids from subsequent wet photo-imaging process steps cannot seep between copper/ceramic sheet layers and cause contamination problems.

Other embodiments are within the scope of the following claims. For example, methods, other than those given above, of providing a weakened eutectic bond or preventing a eutectic bond between a layer of copper and a layer of ceramic could be used.

What is claimed is:

1. An apparatus comprising
    a metal layer,
    an insulating layer directly metal bonded to the metal layer, and
    a solid interrupter formed on the metal or insulating layer between a portion of the insulating layer and a portion of the metal layer, the interrupter reducing the integrity of the bond between the portion of the metal layer and the portion of the insulating layer.

2. The apparatus of claim 1, wherein the interrupter reduces the integrity of the direct metal bond by preventing the bond between the portion of the metal layer and the portion of the insulating layer.

3. The apparatus of claim 1, wherein the interrupter reduces the integrity of the bond by weakening the direct metal bond between the portion of the metal layer and the portion of the insulating layer.

4. The apparatus of claim 1, wherein the insulating layer comprises ceramic.

5. The apparatus of claim 1, wherein the metal layer comprises copper.

6. The apparatus of claim 1, wherein the layers are flat.

7. The apparatus of claim 1, wherein the interrupter comprises metal.

8. The apparatus of claim 1, wherein the interrupter comprises material rubbed onto one of the layers.

9. The apparatus of claim 8, wherein the interrupter comprises material rubbed onto the insulating layer.

10. The apparatus of claim 1, wherein the interrupter comprises nickel plated to the portion of the metal layer.

11. The apparatus of claim 1, wherein the interrupter comprises copper, rubbed on the portion of the insulating layer, and nickel, deposited on the portion of the insulating layer in an area of the copper rub between the copper rub and the portion of the metal layer.

12. The apparatus of claim 11, wherein the nickel is deposited using an electroless process.

13. The apparatus of claim 1, wherein the interrupter comprises nickel rubbed onto the portion of the insulating layer.

14. The apparatus of claim 1, wherein the interrupter comprises iron rubbed onto the portion of the insulating layer.

15. The apparatus of claim 1, wherein the interrupter includes a pattern of interrupters between portions of the metal layer and portions of the insulating layer.

16. The apparatus of claim 1, further comprising
    a conductive run on a substrate electrically connected to the portion of the metal layer on a side of the metal layer opposite to the insulating layer.

17. The apparatus of claim 1, wherein the interrupter includes a pattern of interrupters between portions of the metal layer and portions of the insulating layer, and further comprising
    conductive runs on a substrate electrically connected to the portions of the metal layer on a side of the metal layer opposite to the insulating layer.

18. The apparatus of claim 1, wherein the interrupter includes a pattern of interrupters between portions of the metal layer and portions of the insulating layer, and further comprising
    conductive runs on substrates electrically connected to the portions of the metal layer on a side of the metal layer opposite to the insulating layer.

19. An apparatus formed through a direct copper bonding process, comprising
    a flat copper layer,
    a flat ceramic layer directly bonded to the copper layer, and
    a nickel interrupter formed prior to direct copper bonding and bonded to the copper layer between a portion of the copper layer and a portion of the ceramic layer, the interrupter reducing the integrity of the bond between the portion of the copper layer and the portion of the ceramic layer.

20. An apparatus comprising
    a sandwich structure comprising a metal layer, an insulating layer, and a solid interrupter in between the metal layer and the insulating layer;
    the interrupter being formed on the metal or insulating layer, located in an area, and in contact with the metal layer and the insulating layer;
    wherein the metal layer is secured to the insulating layer by a direct metal bond at least in areas other than the area; and
    wherein a reduced strength direct metal bond or no bond between the metal layer and the insulating layer is located in the area.

21. An apparatus comprising
    a sandwich structure comprising a metal layer, an insulating layer, and a metal interrupter in between the metal layer and the insulating layer;
    the interrupter being formed on the metal or insulating layer, located in an area, and in contact with the metal layer and the insulating layer;
    wherein the metal layer is secured to the insulating layer by a direct metal bond at least in areas other than the area; and
    wherein a reduced strength direct metal bond or no bond between the metal layer and the insulating layer is located in the area.

22. The apparatus of claim 20 or 21, wherein no bond between the metal layer and the insulating layer is located in the area.

23. The apparatus of claim 20 or 21, wherein a reduced strength direct metal bond between the metal layer and the insulating layer is located in the area.

24. The apparatus of claim 20 or 21, wherein the insulating layer comprises ceramic.

25. The apparatus of claim 20 or 21, wherein the metal layer comprises copper.

26. The apparatus of claim 20 or 21, wherein the layers are flat.

27. The apparatus of claim 20 or 21, wherein the interrupter is applied to one of the layers by rubbing.

28. The apparatus of claim 27, wherein the interrupter is rubbed onto the insulating layer.

29. The apparatus of claim 21, wherein the interrupter comprises nickel plated to the metal layer in the area.

30. The apparatus of claim 21, wherein the interrupter comprises a copper portion, rubbed on the insulating layer, and a nickel portion, deposited on the copper portion.

31. The apparatus of claim 30, wherein the nickel portion is deposited using an electroless process.

32. The apparatus of claim 21, wherein the interrupter comprises nickel rubbed onto the insulating layer.

33. The apparatus of claim 21, wherein the interrupter comprises iron rubbed onto the insulating layer.

34. The apparatus of claim 20 or 21, wherein the interrupter comprises a pattern.

35. The apparatus of claim 20 or 21, further comprising
a conductive run on a substrate electrically connected the metal layer in the area on a side of the metal layer opposite to the insulating layer.

36. The apparatus of claim 20 or 21, wherein the interrupter comprises a pattern, and further comprising
conductive runs on a substrate electrically connected to the metal layer in the area on a side of the metal layer opposite to the insulating layer.

37. The apparatus of claim 20 or 21, wherein the interrupter comprises a pattern, and further comprising
conductive runs on substrates electrically connected to the metal layer in the area on a side of the metal layer opposite to the insulating layer.

38. The apparatus of claim 1 or 20 wherein the interrupter comprises a material capable of withstanding direct metal bonding temperatures.

39. The apparatus of claim 19 wherein the interrupter comprises a material capable of withstanding direct metal bonding temperatures.

40. The apparatus of claim 19, wherein the interrupter is plated to the metal layer in a selected area.

41. The apparatus of claim 19 wherein the interrupter comprises a pattern.

* * * * *